US007815766B2

(12) United States Patent
Odawara et al.

(10) Patent No.: US 7,815,766 B2
(45) Date of Patent: Oct. 19, 2010

(54) APPARATUS AND METHOD FOR APPLYING ADHESIVE SHEET

(75) Inventors: Kozo Odawara, Osaka (JP); Atsushi Katayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/442,766

(22) PCT Filed: Sep. 20, 2007

(86) PCT No.: PCT/JP2007/068242

§ 371 (c)(1),
(2), (4) Date: Mar. 25, 2009

(87) PCT Pub. No.: WO2008/038557

PCT Pub. Date: Apr. 3, 2008

(65) Prior Publication Data

US 2009/0321006 A1   Dec. 31, 2009

(30) Foreign Application Priority Data

Sep. 28, 2006   (JP) .............................. 2006-264430

(51) Int. Cl.
| B29C 65/50 | (2006.01) |
| B29C 65/52 | (2006.01) |
| B32B 37/14 | (2006.01) |
| B32B 38/04 | (2006.01) |
| B32B 38/10 | (2006.01) |
| B23K 37/02 | (2006.01) |
| B03B 7/00  | (2006.01) |
| B29C 65/02 | (2006.01) |
| B29C 65/72 | (2006.01) |
| B32B 37/04 | (2006.01) |

(52) U.S. Cl. ........................ 156/266; 156/510; 156/523; 156/527; 156/580; 156/581; 156/583.1; 156/250; 156/254; 156/257; 156/258; 156/261; 156/512

(58) Field of Classification Search .... 156/580–583.91, 156/510, 512, 527, 250, 254, 257, 258, 261, 156/264, 265, 266, 523
See application file for complete search history.

(56) References Cited

U.S. PATENT DOCUMENTS 3,716,432 A * 2/1973 Morrison ..................... 156/63

(Continued)

FOREIGN PATENT DOCUMENTS

JP          10-173321         6/1998

(Continued)

OTHER PUBLICATIONS

International Search Report issued Nov. 27, 2007 in the International (PCT) Application of which the present application is the U.S. National Stage.
International Report on Patentability and PCT Written Opinion, with English translation, issued Apr. 9, 2009 in connection with International Application No. PCT/JP2007/068242 of which the present application is the U.S. National Stage.

*Primary Examiner*—Philip C Tucker
*Assistant Examiner*—Sonya Mazumdar
(74) *Attorney, Agent, or Firm*—Wenderoth, Lind & Ponack, L.L.P.

(57) ABSTRACT

An apparatus for applying adhesive sheets includes a sheet applying base which is placed on a placement base so as to be withdrawable from the placement base and which has a sheet applying region to which adhesive sheets positioned closely before and after a junction portion are to be applied. In the sheet applying base, an upstream-side end portion of the sheet applying region in the adhesive sheet feed direction is placed so as to confront an end portion of the sheet applying head, and moreover a sheet escaping space opened downward is set in place.

13 Claims, 9 Drawing Sheets

U.S. PATENT DOCUMENTS

| | | | |
|---|---|---|---|
| 5,810,966 A * | 9/1998 | Semba | 156/530 |
| 7,290,580 B2 * | 11/2007 | Naitoh et al. | 156/581 |
| 2004/0031570 A1 * | 2/2004 | Kim et al. | 156/510 |
| 2005/0260341 A1 | 11/2005 | Nishimoto et al. | |
| 2006/0000918 A1 * | 1/2006 | Kano et al. | 235/492 |
| 2009/0288777 A1 * | 11/2009 | Odawara et al. | 156/538 |
| 2010/0126654 A1 * | 5/2010 | Katayama et al. | 156/159 |

FOREIGN PATENT DOCUMENTS

| | | |
|---|---|---|
| JP | 2000289900 A * | 10/2000 |
| JP | 3271537 | 4/2002 |
| JP | 2003-051517 | 2/2003 |
| JP | 2003-209143 | 7/2003 |
| JP | 3704502 | 10/2005 |
| WO | 03/060988 | 7/2003 |
| WO | WO 2004011356 A1 * | 2/2004 |
| WO | WO 2007069421 A1 * | 6/2007 |

* cited by examiner

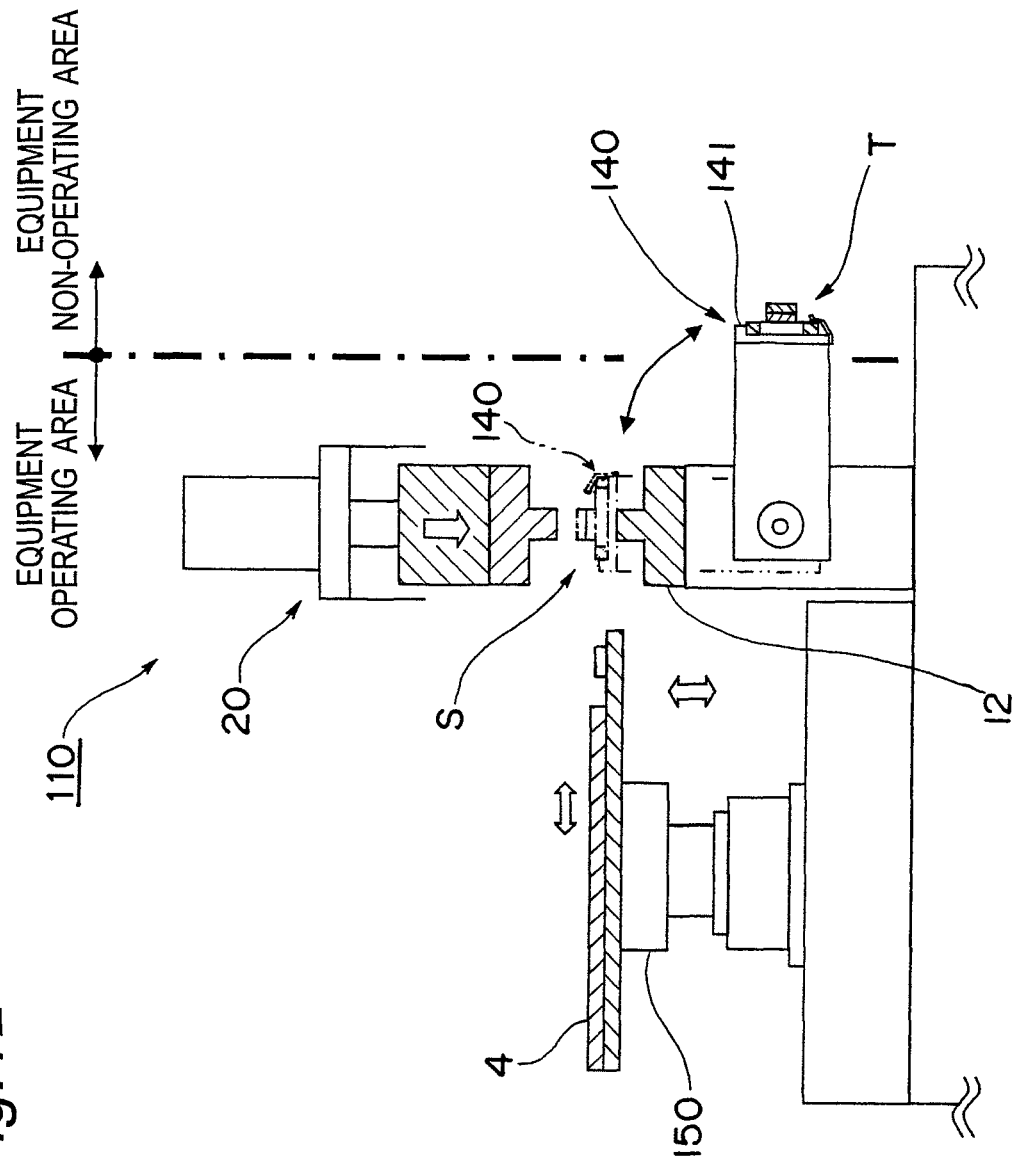

APPARATUS AND METHOD FOR APPLYING ADHESIVE SHEET

TECHNICAL FIELD

The present invention relates to apparatus and method for applying an adhesive sheet onto a display panel, or other like object, such as a liquid crystal panel or a PDP (Plasma Display Panel), and an adhesive sheet for fixation of mounting components. In particular, the invention relates to an apparatus and method for applying an adhesive sheet using a separation-sheet added adhesive sheet in which junction portions are formed by joining together end portions of longitudinally succeeding adhesive sheets one to another.

BACKGROUND ART

Conventionally, there have been known component mounters which are designed such that an adhesive sheet for fixation of mounting components is applied onto a display panel such as a liquid crystal panel and, on this adhesive sheet, mounting components are to be pressure bonded. In one example of those component mounters, with a separation-sheet added ACF (Anisotropic Conductive Film) applied to a liquid crystal panel, the separation-sheet of the ACF is separated off and thereafter mounting components (e.g., thin-type LSI package components) are pressure bonded to the ACF, by which components are mounted on the liquid crystal panel. Such a conventional component mounter is equipped with an ACF applying device to fulfill the ACF applying.

In the conventional ACF applying device described above, in the feeding of a separation-sheet added ACF wound around a reel, the ACF is cut into pieces of a specified length and fed onto a board placed on a stage, and then pressed by a head so that the ACF (ACF pieces) cut into a specified length is applied onto the board, while the separation-sheet is separated off, and thus the ACF applying operation is accomplished. Such a sequential ACF applying operation is repeatedly performed, by which ACF applying operations for a plurality of ACF applying positions on the board are carried out.

In the conventional ACF applying device described above, with a view to lessening the replacement frequency of the reel, a reel in which a plurality of succeeding ACFs are joined together by seams is used, and positions of the seams are detected by detection means. In this arrangement, to remove the ACFs placed closely before and after the seams from the separation-sheet, a removal-applying operation for the ACFs placed closely before and after the seams onto a removal-applying stage prepared in addition to the stage is executed. Thus, it is possible to continue the production after completion of the removal-applying operation without so much interruption (see, e.g., JP 2003-209143 A).

DISCLOSURE OF THE INVENTION

Problems to be Solved by the Invention

Some of the issues that would be involved in the removal-applying operation of ACFs in a conventional ACF applying device are hereinafter described in detail with reference to schematic explanatory views shown in FIGS. 13A, 13B, 13C and 13D. First, as shown in FIG. 13A, in the ACF applying device, an already removal-applied ACF 512 has been applied on a removal-applying stage 511. In this state, an ACF 513 (with separation-sheet 514 added) to be next removal-applied is aligned with the removal-applying stage 511. After this alignment, as shown in FIG. 13B, a head 520 goes down, the ACF 513 to be next removal-applied is pressed and applied onto the removal-applying stage 511 via the already removal-applied ACF 512. In this operation, the ACFs 512, 513 are elongated and expanded by the pressing force of the head 520 with the result that the ACF has partly come out from an end portion of the pressing face of the head 520.

Such a removal-applying operation for a plurality of ACFs to be removal-applied is repeatedly performed, by which the ACF having come out from the pressing surface of the head 520 is put into a swollen state and settled as it is as shown in FIG. 13C, so that a removal-applied ACF raised portion 515 is formed. As shown in FIG. 13D, such a removal-applied ACF raised portion 515 comes into contact with part of an ACF 516 to be next applied out of the separation-sheet added ACF (see a P portion in FIG. 13D), causing an issue that the ACF 516 is partly separated from the separation-sheet 514, resulting in occurrence of an ACF applying error.

For prevention of such ACF applying errors, there has been adopted a technique that the number of times of removal-applying for ACFs to be stacked in succession on the removal-applying stage 511 is restricted to several times or so, and after the removal of ACFs from the removal-applying stage 511, the removal-applying operation is continued. However, such a technique would obstruct the execution of efficient ACF applying. Further, although it is also conceivable to do the removal-applying operation with the ACF applying position changed in the removal-applying stage 511, such a technique would cause the removal-applying stage to be upsized, making an obstacle to productivity improvement in the ACF applying.

Accordingly, an object of the present invention, lying in solving the above-described issues, is to provide an apparatus and method for applying an adhesive sheet capable of efficiently fulfilling an adhesive sheet applying operation by virtue of the capability that, in the adhesive sheet applying in which separation-sheet added adhesive sheets having junction portions formed by seaming one end portion to another of longitudinally succeeding adhesive sheets which are fed in succession in the longitudinal direction and applied onto an object and then the separation-sheet separated from the adhesive sheet is discharged, the number of times of execution of the removal-applying operation, which is an operation performed to remove the adhesive sheet from closely before and after the junction portions, i.e., the number of stacked layers of adhesive sheets, can be increased while preventing the occurrence of applying errors, and thus an efficient adhesive sheet applying operation.

Means for Solving the Subject

In order to achieve the above object, the present invention has the following constitutions.

According to a first aspect of the present invention, there is provided an apparatus for applying adhesive sheets in which separation-sheet added adhesive sheets are fed in succession in a longitudinal direction, a junction portion being formed by seaming together end portions of longitudinally succeeding adhesive sheets, then the adhesive sheets are applied onto an object, and then the separation-sheet separated from the adhesive sheets is discharged, the apparatus comprising:

a placement base on which the object is to be placed;

a sheet feeder for feeding the adhesive sheets above the object;

a sheet cutter for cutting the adhesive sheets in a length necessary for the applying;

a sheet applying head for pressing and applying the cut adhesive sheet to the object, the sheet applying head being placed so as to confront the placement base; and a sheet applying base which is placed on the placement base so as to be withdrawable from the placement base and which has a sheet applying region to which adhesive sheets closely before and after the junction portion is to be applied, wherein the sheet applying base is so placed that an upstream-side end portion of the sheet applying region in an adhesive sheet feed direction is opposed to an end portion of the sheet applying head, and moreover the upstream-side end portion of the sheet applying region on the sheet applying base is opened downward.

According to a second aspect of the present invention, there is provided the apparatus for applying adhesive sheets as defined in the first aspect, wherein the sheet applying base has a sheet escaping space which is formed so as to adjoin the upstream-side end portion of the sheet applying region and to make the end portion opened downward.

According to a third aspect of the present invention, there is provided the apparatus for applying adhesive sheets as defined in the second aspect, wherein the sheet applying base has a recess portion which is formed so as to adjoin the end portion of the sheet applying region, and an internal space of the recess portion serving as the sheet escaping space.

According to a fourth aspect of the present invention, there is provided the apparatus for applying adhesive sheets as defined in the second aspect, wherein the sheet applying base has a stepped portion which is formed so as to adjoin the end portion of the sheet applying region, and the stepped portion forms the sheet escaping space.

According to a fifth aspect of the present invention, there is provided the apparatus for applying adhesive sheets as defined in any one of the second to fourth aspects, further comprising a sheet applying base moving device for moving the sheet applying base between a sheet applying position on the placement base and a sheet removal position which is a position withdrawn from on the placement base and at which the adhesive sheet applied onto the sheet applying base is removable.

According to a sixth aspect of the present invention, there is provided the apparatus for applying adhesive sheets as defined in any one of the second to fourth aspects, wherein the sheet applying base comprises:

a sheet applying plate in which the sheet applying region is set; and a plate support member to which the sheet applying plate is removably fitted and which supports the fitted plate, wherein the sheet escaping space is placed so as to adjoin the upstream-side end portion of the sheet applying region set on top of the sheet applying plate.

According to a seventh aspect of the present invention, there is provided the apparatus for applying adhesive sheets as defined in the sixth aspect, wherein the sheet applying plate is formed from a heat insulating material which is higher in thermal insulation property than the plate support member.

According to an eighth aspect of the present invention, there is provided the apparatus for applying adhesive sheets as defined in the sixth aspect, wherein in the sheet applying plate, an opening is formed so as to adjoin the upstream-side end portion of the sheet applying region, whereby the sheet escaping space is formed.

According to a ninth aspect of the present invention, there is provided the apparatus for applying adhesive sheets as defined in the first aspect, wherein a downwardly directed curved portion is formed at the upstream-side end portion of the sheet applying region on the sheet applying base.

According to a tenth aspect of the present invention, there is provided the apparatus for applying adhesive sheets as defined in the first aspect, wherein an end face of the upstream-side end portion of the sheet applying region on the sheet applying base is inclined by more than 90 degrees with respect to a horizontal direction.

According to an eleventh aspect of the present invention, there is provided a method for applying adhesive sheets for, with separation-sheet added adhesive sheets in which junction portions are formed by seaming together end portions of longitudinally succeeding the adhesive sheets, cutting the adhesive sheet in a length necessary for applying, feeding the cut adhesive sheet to between an object placed on a placement base and a sheet applying head placed opposite to the placement base, pressing and applying the cut adhesive sheet to the object by the sheet applying head, and thereafter discharging separation-sheet separated from the adhesive sheet, the method comprising:

cutting the adhesive sheet adjacent to the junction portion;

in a sheet applying base placed on the placement base, aligning an upstream-side end portion of the adhesive sheet in a sheet feed direction so that the upstream-side end portion of the adhesive sheet becomes vertical to an end portion of a sheet applying region having a downwardly opened upstream-side end portion in the sheet feed direction, and to an upstream-side end portion of the sheet applying head in the sheet feed direction;

thereafter, while pressing the cut adhesive sheet by the sheet applying head so that the upstream-side end portion of the adhesive sheet elongated and expanded by the pressing is allowed to escape downward at the opened end portion of the sheet applying region, applying the adhesive sheet to the sheet applying region of the sheet applying base, and removing an adhesive sheet adjacent to the junction portion from the separation-sheet.

According to a twelfth aspect of the present invention, there is provided the method for applying adhesive sheets as defined in the eleventh aspect, comprising:

after the adhesive sheet is removed from the separation-sheet, cutting the adhesive sheet adjacent to the next-coming junction portion;

aligning the upstream-side end portion of the adhesive sheet vertically to the end portion of the sheet applying region on the sheet applying base and to the end portion of the sheet applying head;

thereafter, while pressing the cut adhesive sheet by the sheet applying head so that upstream-side end portions of the adhesive sheet elongated and expanded by the pressing and a previously removal-applied adhesive sheet, respectively, are allowed to escape downward at the opened end portion of the sheet applying region, applying the adhesive sheet in superimposition on the previously removal-applied adhesive sheet, and removing an adhesive sheet adjacent to the next-coming junction portion from the separation-sheet.

Effects of the Invention

According to the present invention, in a sheet applying base to which adhesive sheets are to be applied by a removal-applying operation, which is an operation for removing unnecessary adhesive sheets from a separation-sheet, an upstream-side end portion of the sheet applying region in the adhesive sheet feed direction is placed so as to confront an end portion of the sheet applying head, and moreover a portion of the region adjacent to the upstream-side end portion is opened downward. As a result of this, even if an upstream-side end portion of the applied sheet is elongated and expanded toward the upstream side of the sheet applying region by repeated removal-applying operations executed on the sheet applying region, such an elongated and expanded portion is not swollen upward but allowed to escape downward. Therefore, the possibility that such an elongated and expanded portion may come into contact with the next-applied adhesive sheet and cause applying errors can be reliably prevented. Thus, in the apparatus for performing applying of adhesive sheets, the number of times of repetitive execution of the removal-applying operation can be increased, so that efficient applying can be realized.

BRIEF DESCRIPTION OF DRAWINGS

These and other aspects and features of the present invention will become clear from the following description taken in conjunction with the preferred embodiments thereof with reference to the accompanying drawings, in which:

FIG. 12 is a schematic structural view showing a structure of an ACF applying device according to a modification of the embodiment;

DETAILED DESCRIPTION OF THE INVENTION

Figure 1:
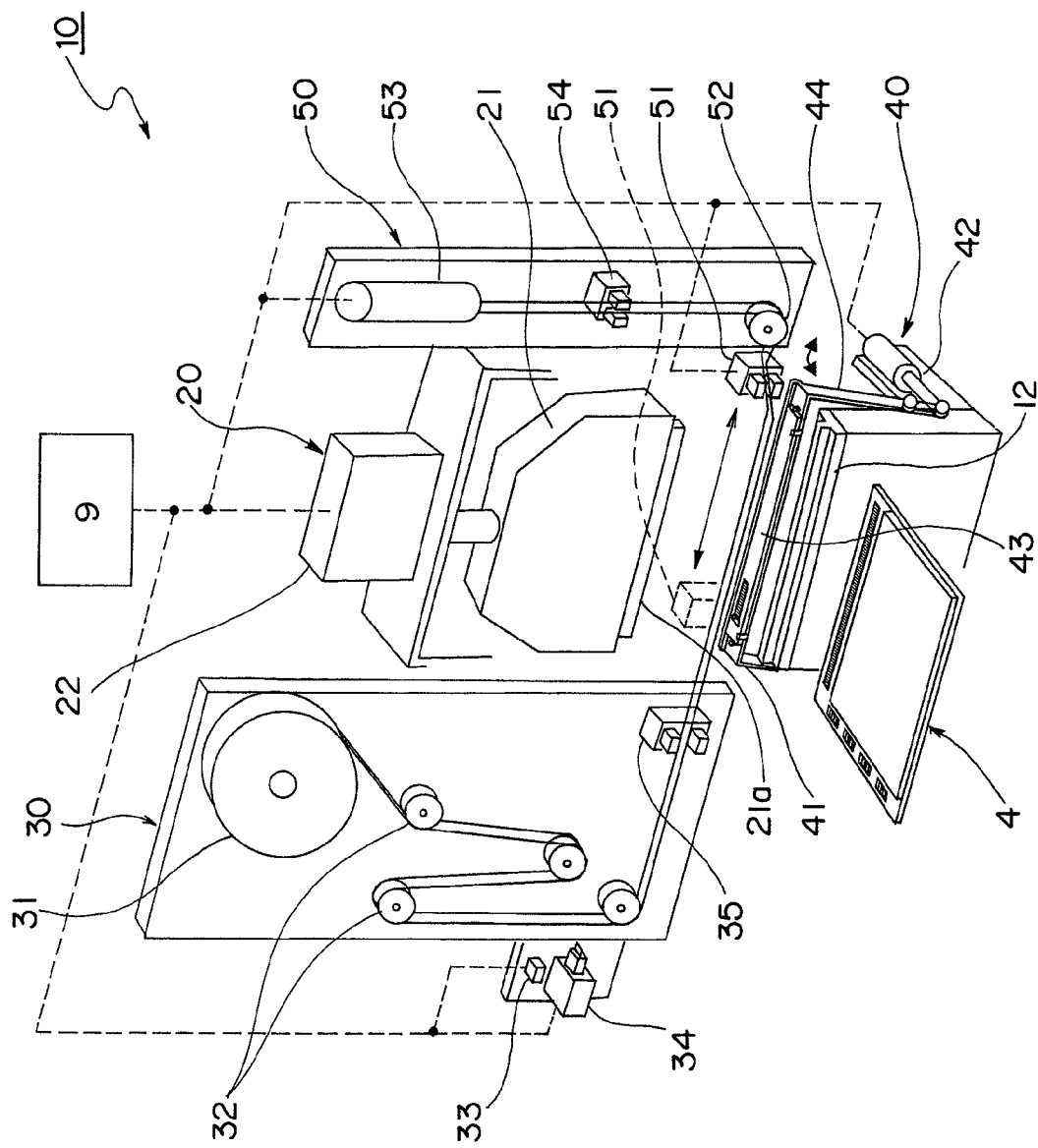
FIG. 1 is a schematic structural view of an ACF applying device according to an embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

FIG. 1 is a schematic perspective view showing the structure of an ACF applying device 10, which is an example of a separation-sheet added adhesive sheet applying device according to an embodiment of the invention. The ACF applying device of FIG. 1 is an apparatus which applies an ACF (Anisotropic Conductive Film), as an example of an adhesive sheet, to a liquid crystal panel (hereinafter, referred to as 'panel') as an applying object, and which separates the separation-sheet of the ACF to set up a state that components can be mounted onto the panel via the applied ACF. In this embodiment, the following description will be given below on a case where the adhesive sheet is exemplified by an ACF sheet in which anisotropic conductive particles are contained. However, such an adhesive sheet may also be given by using sheets containing no anisotropic conductive particles (i.e., sheets not having an electrical conduction function but having an adhesion function).

In the ACF applying device 10 shown in FIG. 1, a pressure bonding unit 20 is placed so as to be opposed to a stage 12, which is a placement base on which the panel is to be placed. The stage 12 allows a liquid crystal panel 4, which is an applying object, to be set thereon. With the pressure bonding unit 20 interposed, on the left side in the figure is an ACF feed unit 30 for feeding ACF sheets wound around a reel to a position between the pressure bonding unit 20 and the stage 12, while on the right side in the figure is a separation sheet collection unit 50 for collecting a separation sheet from which the ACF has been separated. In addition, the panel 4 is held by an unshown table, and the held panel 4 is movable in horizontal and up-and-down directions and rotatable within a horizontal plane. It is noted that peripheral portions in the panel 4 serve as component mounting areas, i.e., areas in which ACFs are to be applied.

As shown in FIG. 1, the pressure bonding unit 20, which has, in its lower surface, a pressure bonding surface 21a confronting the stage 12 placed thereunder, includes a head 21 as an example of a sheet applying head for performing ACF applying operation, and a head up/down unit 22 for moving up and down the head 21. The head 21, which contains unshown heating means, is enabled to heat the pressure bonding surface 21a of the head 21 to a specified temperature.

The ACF feed unit 30 includes a reel 31 on which ACF sheets are wound, a plurality of rollers 32 for guiding ACFs fed from the reel 31, a seam detection sensor 33 which is an example of detection means for detecting seams of ACFs, and a cutter 34 which is an example of a sheet cutting part for forming cuts-in on the sequence of ACFs affixed on the separation sheet so that the ACFs are cut into a specified length corresponding to the size of the component mounting areas in the panel 4.

The separation sheet collection unit 50 includes: a feed chuck (sheet feeder) 51 which, when moved rightward in the figure above the stage 12 while releasably grasping the ACF-separated separation sheet, performs ACF advance/feed operation from the reel 31 and separation-sheet advance/discharge operation from above the stage 12; a roller 52 which guides the feed destination of the separation sheet fed and discharged by the feed chuck 51; and a sheet collector 53 by which the separation sheet is collected. In addition, the ACF feed unit 30 and the separation sheet collection unit 50 are equipped with lock chucks 35, 54, respectively, for grasping the sheet in association with execution of the sheet feed operation by the feed chuck 51 or the like.

Figure 2:
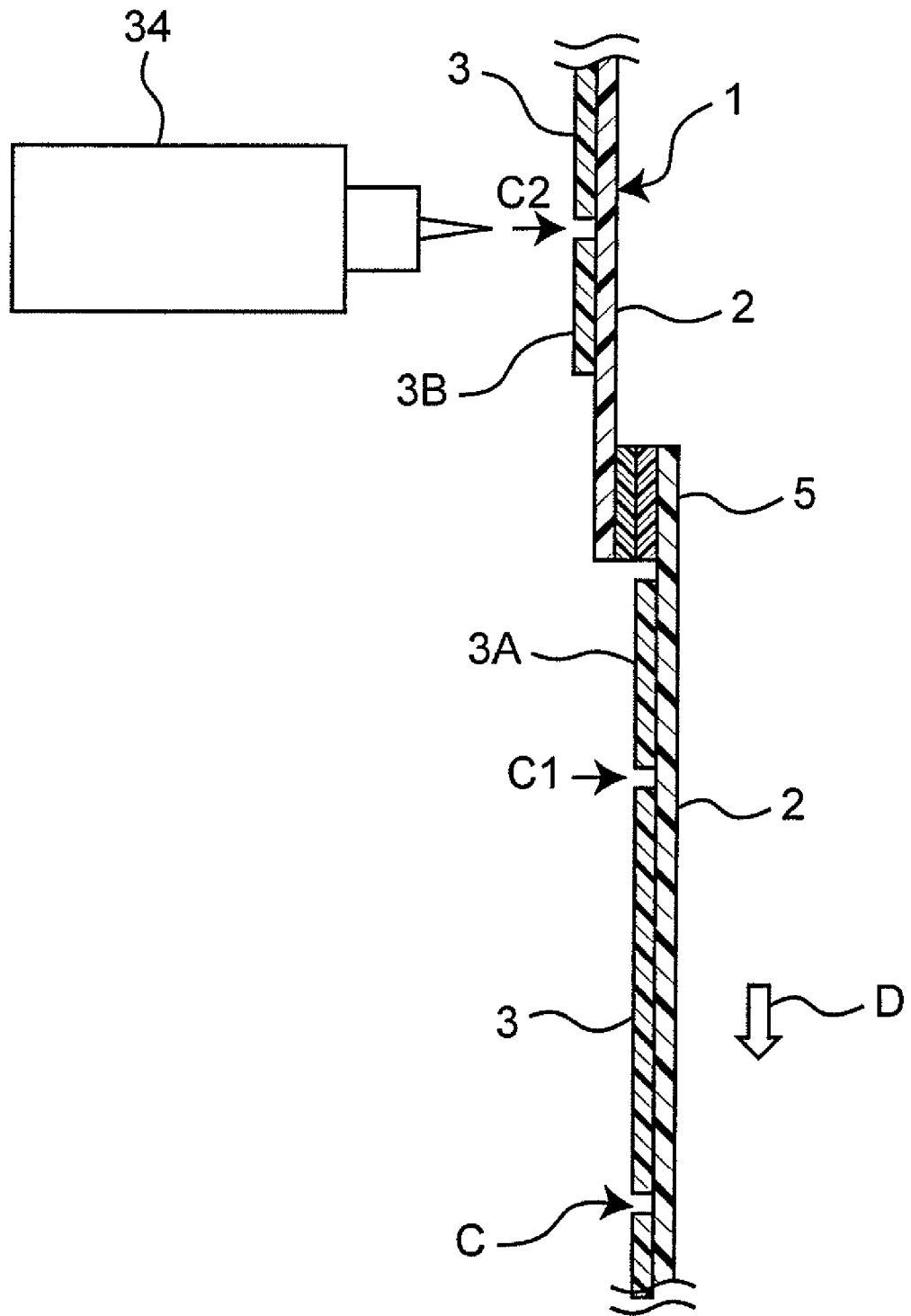
FIG. 2 is a schematic structural view of ACF sheets treated by the ACF applying device of FIG. 1.

Now the structure of the separation-sheet added ACF sheet to be treated by the ACF applying device 10 is explained with reference to the schematic view of FIG. 2. As shown in FIG. 2, an ACF sheet 1 is structured such that ACFs 3 are successively attached to a separation sheet 2 along a longitudinal direction and moreover a junction portion (or a seam of ACF sheets) 5 is formed by seaming together end portions of ACF sheets 1 by using a double-sided sheet or the like. In such an ACF sheet 1, cuts-in C are formed in ACFs 3 by the cutter 34 so that ACFs 3, i.e. ACF pieces, of a specified length can be obtained.

In the case where such an ACF sheet 1 having seams 5 is used, as shown in FIG. 2, with respect to an ACF 3 closely before and after the seam 5, i.e., with respect to the seam 5, a before-seam ACF 3A adjacently on the downstream side of a sheet feed direction D and an after-seam ACF 3B located adjacently on the upstream side of the sheet feed direction D are not used for panel applying but subjected to so-called "removal-applying operation (applying operation for removing ACFs)," which is an applying operation of the before-seam ACF 3A and the after-seam ACF 3B for removing the ACFs 3A and 3B from the separation sheet 2. For execution of such a removal-applying operation, the ACF applying device 10 is equipped with a removal-applying unit 40.

As shown in FIG. 1, the removal-applying unit 40 includes a removal-applying stage 41 as an example of a sheet applying base which is placed above the stage 12 and which has a sheet applying region on top of which unnecessary ACFs are to be applied by the removal-applying operation, and a removal-applying stage moving unit 42 as an example of a sheet applying base moving device which moves the removal-applying stage 41 between a sheet applying position that is a position above the stage 12 and a withdrawal position that is a position withdrawn from above the stage 12 so as to prevent any interference in ACF applying operation on the panel 4 by the head 21.

Figure 3:
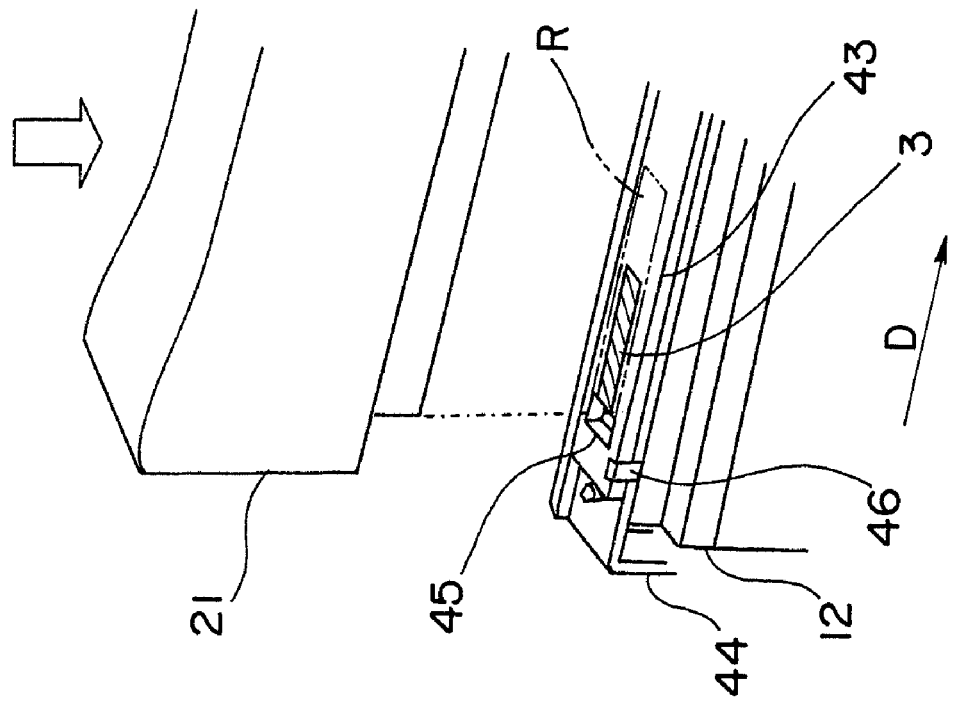
FIG. 3 is a partial schematic structural view of a removal-applying unit in the ACF applying device of FIG. 1.
Figure 4:
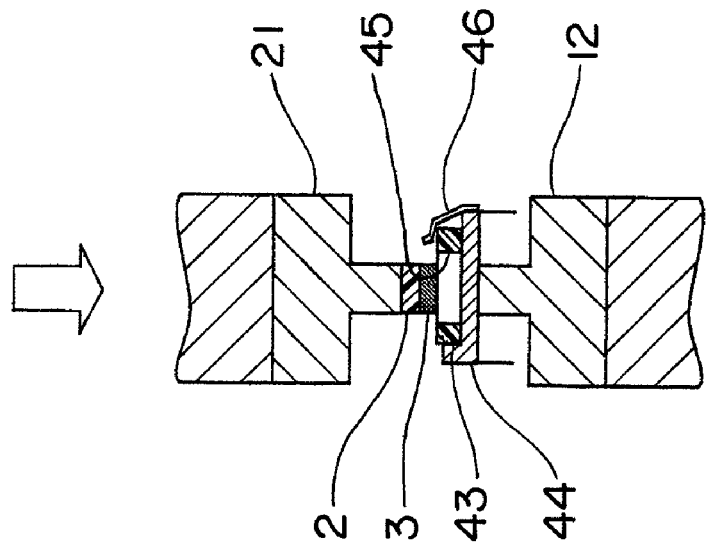
FIG. 4 is a partial schematic sectional view of the removal-applying unit in the ACF applying device of FIG. 1.

FIG. 3 is a partial schematic perspective view of the removal-applying stage 41, and FIG. 4 is a partial schematic sectional view thereof. The above-described structure is explained in more detail below with reference to FIGS. 1, 3 and 4.

First, the removal-applying stage 41 is made up of a sheet applying plate 43 on top of which a sheet applying region R is set, and a plate support arm 44 as an example of a plate support member to which the sheet applying plate 43 is to be removably fitted and which supports the sheet applying plate 43. The plate support arm 44, as shown in FIG. 1, is generally U-shaped and extends longitudinally above the stage 12, and is superposed at its both end portions. The removal-applying stage moving unit 42 fulfills the movement of the removal-applying stage 41 when pivoted with a cylinder mechanism or the like on fulcrums given by the end portions of the U-shape of the plate support arm 44.

Also, as shown in FIGS. 3 and 4, in the sheet applying plate 43, an opening hole (opening portion) 45 having a generally rectangular shape, for example, is formed near an end portion of the sheet applying plate 43 on the upstream side of the sheet feed direction D, where an end portion of the opening hole 45 on the downstream side of the sheet feed direction D is coincident with an end portion of the sheet applying region R on the upstream side of the sheet feed direction D. The opening hole 45 is so formed that its length in a direction perpendicular to the sheet feed direction D becomes larger than the width of each ACF to be applied, i.e., the width of the sheet applying region R. Further, as shown in FIGS. 3 and 4, the plate 43, while being regulated in its longitudinal position and widthwise position, is releasably fixed on an upper surface of the plate support arm 44 with a presser bar 46 such as a plate spring. As the plate 43 and the plate support arm 44 are integrally viewed, the opening hole 45 formed in the plate 43 can also be viewed as a recess portion having a bottom face at which the upper face of the plate support arm 44 is placed. The fixation position for the plate 43 is determined so that an end portion of the head 21 on the upstream side of the sheet feed direction D and an end portion of the opening hole 45 on the downstream side of the sheet feed direction D (i.e., an end portion of the sheet applying region R on the upstream side of the sheet feed direction D) become coincident with each other (see FIG. 3). By the formation of such an opening hole 45 in the sheet applying plate 43, a structure is realized in which the upstream-side end portion of the sheet applying region R in the plate 43 is opened downward, where the downwardly opened portion like this serves as a sheet escaping space to allow an ACF, which has been elongated and expanded as described later, to escape.

Preferably, the sheet applying plate 43 is formed from a material having enough thermal resistance to withstand the heat quantity transferred from the head 21, such a thermal insulation as to make the transferred heat quantity less escapable, and such a chemical resistance as to withstand the use with solvents. As resin materials that satisfy such conditions, polyetherimide resins (e.g., ULTEM resin (brand name or registered trademark)) are used in this embodiment, but otherwise glass-based materials or the like may be used. In addition, the plate 43 is formed at a thickness of, for example, about 2 mm. Also, the plate support arm 44 is formed from a rigid material, e.g. stainless material, so as to sufficiently withstand the pressing load burdened from the head 21. Further, although the plate support arm 44 is given by adopting one which has a generally U-shaped, simple beam structure as shown in FIG. 1, a cantilever structure may also be adopted depending on the size of the stage 12 or the like.

The ACF applying device 10 having such a structure as described above includes a control unit 9 which integrally controls operations of the above-described individual constituent parts in association with one another. More specifically, the control unit 9 is enabled to fulfill control of ACF sheet feed operation and separation sheet collection operation by the ACF feed unit 30 and the separation sheet collection unit 50, respectively, and control of ACF applying operation including (heating operation) by the pressure bonding unit 20, control of movement operation of the removal-applying stage 41 in the removal-applying unit 40, and control of ACF cutting operation by the cutter 34. In addition, detection information as to seams of ACF sheets by the seam detection sensor 33 is inputted to the control unit 9, and cutting operation for the before-seam ACFs and after-seam ACFs by the cutter 34 is controlled so that cuts-in are formed at desired positions. Moreover, an ACF feed rate corresponding to the formation positions of those cuts-in is controlled.

Figure 5:
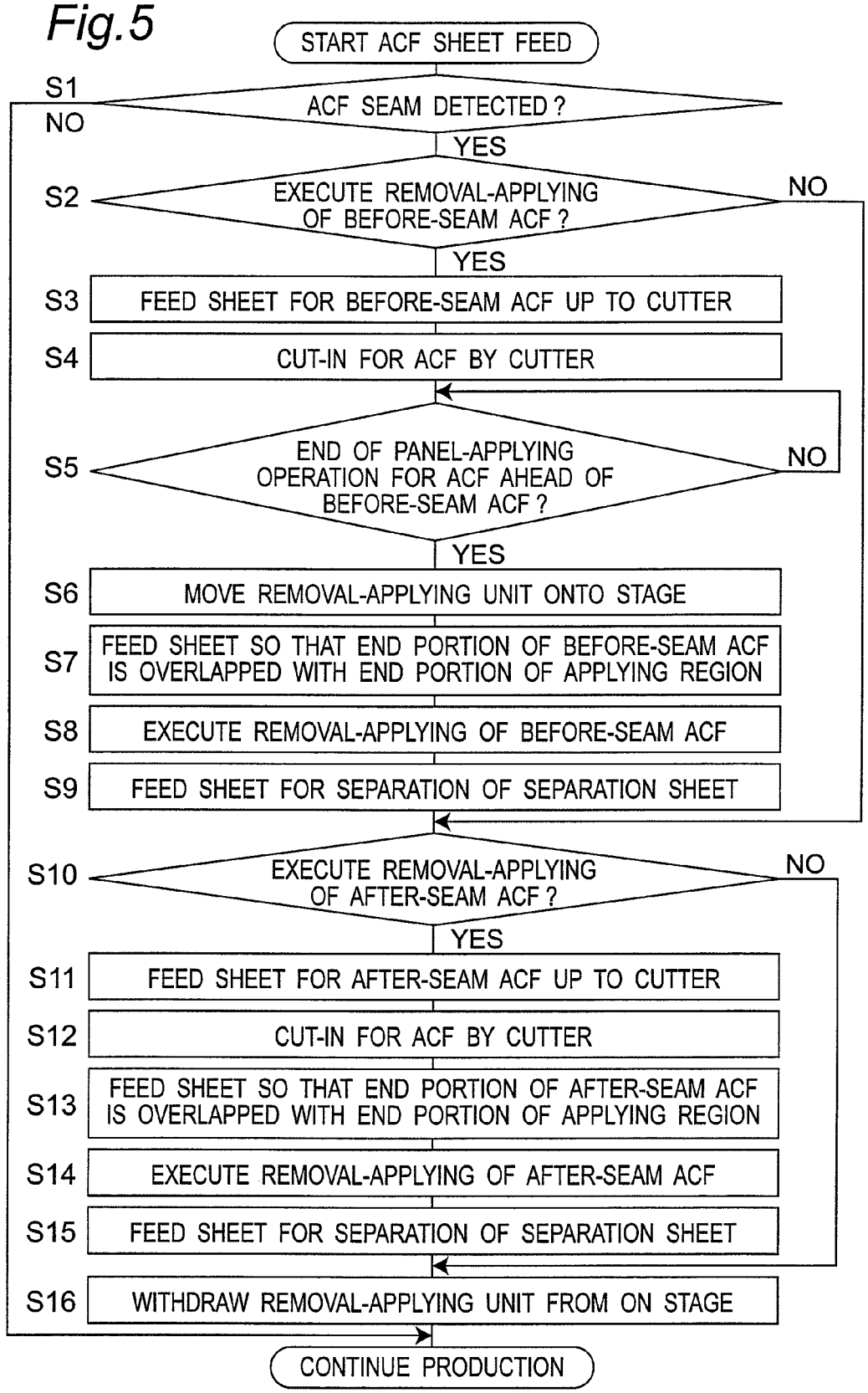
FIG. 5 is a flowchart showing the procedure of ACF removal-applying operation to be performed by the ACF applying device of FIG. 1.

Next, the ACF removal-applying operation to be performed by the ACF applying device 10 of this embodiment is described. In conjunction with this description, FIG. 5 shows a flowchart of the procedure of the removal-applying operation, and FIG. 6 shows schematic explanatory views for explaining main operations in the procedure. It is noted that the operations explained below are to be performed by the control unit 9 controlling individual constituent parts in the ACF applying device 10.

First, while applying of ACFs 3 to the panel 4 is continuously performed in the ACF applying device 10, the feed chuck 51 of the separation sheet collection unit 50 positioned on the left side in FIG. 1 grasps the separation sheet 2, from which the ACFs 3 have been separated, and moves rightward in the figure, by which the separation sheet 2 is collected and moreover the ACF sheet 1 is fed by the ACF feed unit 30. The seam detection sensor 33 continuously performs the detection of seams 5 (see FIG. 2) in the ACF sheet 1 that is under such sheet feed. At step S1 in the flowchart of FIG. 5, when a seam 5 is detected by the seam detection sensor 33, this detection information is inputted to the control unit 9. At step S2, it is decided whether or not to execute a removal-applying operation for the before-seam ACF 3A (see FIG. 2).

If it is decided that the removal-applying operation is to be executed, sheet feed is executed so that a position in the ACF sheet 1 which should be a downstream-side end portion of the before-seam ACF 3A (i.e., position C1 in FIG. 2) is set to a cutting position by the cutter 34 (step S3). Thereafter, at step S4, a cut-in C1 is formed in the ACF 3 by the cutter 34. Even under the progress of such an operation, the applying operation of ACFs 3 on the downstream side of the before-seam ACF 3A to the panel 4 is continuously being carried out. If it is confirmed at step S5 that the applying operation of those ACFs 3 is completed, then, at step S6, the removal-applying stage 41 is moved to the sheet applying position (i.e., a position above the stage 12) by the removal-applying stage moving unit 42. Thereafter, sheet feed by the feed chuck 51 is executed so that the upstream-side end portion of the before-seam ACF 3A is overlapped with the upstream-side end portion of the sheet applying region R.

After the alignment of the two ACFs by sheet feed is accomplished, a removal-applying operation for the before-seam ACF 3A is executed (step S8). More specifically, the head 21 is moved down by the head up/down unit 22, and the before-seam ACF 3A is pressed and heated, and thereby applied, against the sheet applying region R of the sheet applying plate 43 via the separation sheet 2 by the pressure bonding surface 21a of the head 21. This results in a state that the upstream-side end portion of the before-seam ACF 3A is generally coincident with the upstream-side end portion of the sheet applying region R as well as the downstream-side end portion of the opening hole 45 (see FIG. 3). Thereafter, the feed chuck 51 located on the right hand in FIG. 1 is moved leftward in the figure, causing the separation sheet 2 to be separated from the ACF 3A, and further the feed chuck 51 grasping the separation sheet 2 is moved rightward in the figure, thus the sheet feed being accomplished (step S9).

Next, at step S10, it is decided whether or not a removal-applying operation for the after-seam ACF 3B (see FIG. 2) is executed. If it is decided that the removal-applying operation is executed, then sheet feed is executed at step S11 so that a position which should be an upstream-side end portion of the after-seam ACF 3B (i.e., position C2 in FIG. 2) is set to a cutting position by the cutter 34. This sheet feed operation may also be performed as the sheet feed operation of step S9. Thereafter, a cut-in C2 is formed in the ACF 3 by the cutter 34 at step S12, and sheet feed by the feed chuck 51 is executed at step S13 so that the upstream-side end portion of the after-seam ACF 3B is overlapped with the upstream-side end portion of the sheet applying region R.

Figure 6A:
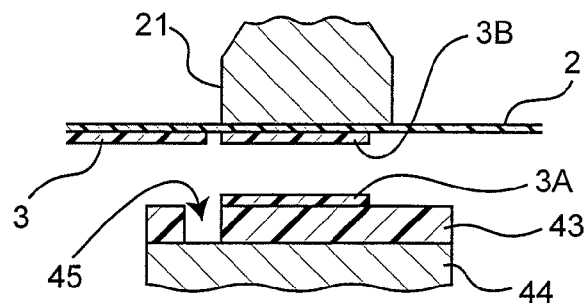
FIG. 6A is a schematic explanatory view for explaining the removal-applying operation procedure of FIG. 5, showing a state that an after-seam ACF and a sheet applying region are aligned with each other.
Figure 6B:
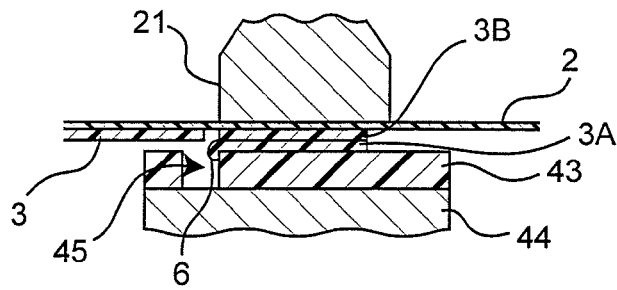
FIG. 6B is a schematic explanatory view for explaining the removal-applying operation procedure of FIG. 5, showing a state that the after-seam ACF has been removal-applied.

The resulting state being the state shown in FIG. 6A, the head 21 is moved down and the removal-applying for the after-seam ACF 3B is executed as in the removal-applying for the before-seam ACF 3A (step S14). Whereas the after-seam ACF 3B pressed by the head 21 is so applied as to be overlapped with the already applied before-seam ACF 3A, part of the ACF 3A or 3B is elongated and expanded from the upstream-side end portion of the ACF toward the upstream side (rightward in the figure) by the pressing force from the head 21 as shown in FIG. 6B. Since the upstream-side end portion of the applied before-seam ACF 3A and 3B is generally coincident with the end portion of the opening hole 45 of the plate 43, such elongated and expanded ACF enters into the opening hole 45 and, with action of gravity or the like added, the ACF elongates and expands downward within the opening hole 45, resulting in formation of an elongated and expanded portion 6.

After the removal-applying operation for the after-seam ACF 3B has been executed, separation of the separation sheet 2 as well as the feed of the ACF sheet 1 are executed at step S15. Thereafter, the removal-applying stage 41, which has been positioned at the sheet applying position, is moved to the withdrawal position of withdrawal from above the stage 12 (step S16), where production in the ACF applying device 10, i.e. ACF applying to the panel 4, is restarted. Then, each time an ACF seam 5 is detected at step S1, the sequence of removal-applying operations of steps S2 to S16 are executed. In addition, if it is decided at step S2 that the removal-applying operation for the before-seam ACF 3A is not executed, then the procedure of steps S3 to S9 is skipped. Also, if it is decided at step S10 that the removal-applying for the after-seam ACF 3B is not executed, then the procedure of steps S11 to S16 is skipped.

Figure 6C:
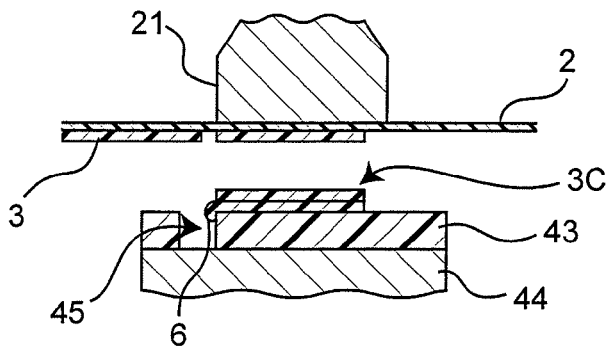
FIG. 6C is a schematic explanatory view for explaining the removal-applying operation procedure of FIG. 5, showing a state that an upstream-side end portion of the removal-applied ACF is allowed to escape downward within an opening hole.
Figure 6D:
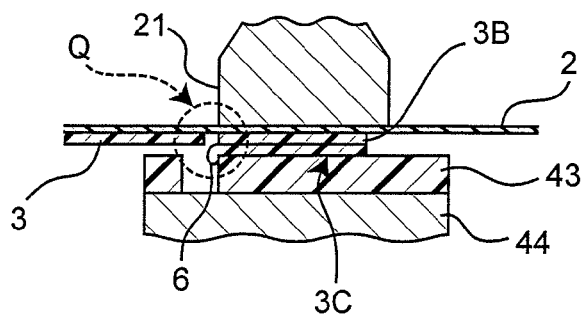
FIG. 6D is a schematic explanatory view for explaining the removal-applying operation procedure of FIG. 5, showing a state that still another ACF has been removal-applied in superimposition, where contact between the removal-applied ACF and a next-coming ACF is avoided.

For example, as shown in FIG. 6C, if a further removal-applying operation (e.g., a removal-applying operation for another after-seam ACF 3B) is executed on the removal-applying stage 41 that has already been subjected to removal-applying operations for a plurality of ACFs 3C, then the upstream-side end portion of the after-seam ACF 3B and the upstream-side end portion of the sheet applying region R are aligned with each other by sheet feed and thereafter, as shown in FIG. 6D, the after-seam ACF 3B is applied by the head 21 so as to be overlapped with the already applied ACFs 3C. In this applying, the ACFs 3C that have already been applied, in particular, are further elongated and expanded by the pressing force of the head 21, causing the elongated and expanded portion 6 of the ACFs to grow larger. In this case, since the opening hole 45 is provided adjacent to the upstream-side end portion, the elongated and expanded portion 6 is elongated and expanded downward within the elongated and expanded portion 6. Accordingly, at a place indicated by Q in FIG. 6D (shown by a broken-line circle in the figure), the ACF elongated and expanded portion 6 and the ACF 3 to be next applied in the ACF sheet 1 can be prevented from making contact with each other with reliability.

Thus, in the removal-applying stage 41 of the ACF applying device 10, the opening hole 45 is provided so as to adjoin an end portion of the sheet applying region R on the upstream side of the sheet feed direction, and the removal-applying operation is repeatedly performed so that the ACFs 3A and 3B before and after the seam in this upstream-side end portion are coincident with each other. Thus, the ACFs elongated and expanded by the repeated removal-applying operations are prevented from residing at the same position and being swollen, and can be elongated and expanded downward within the opening hole 45. Accordingly, an ACF that has been subjected to the removal-applying operation so as to be applied to the removal-applying stage 41 and the ACFs 3 of the ACF sheet 1 can be prevented from making contact with each other.

In particular, in a case where an ACF sheet having seams is used for improvement of production efficiency, the number of times of execution of the ACF removal-applying operation increases. However, adopting the removal-applying stage of this embodiment makes it possible to largely reduce the removal frequency of already applied ACFs from on the removal-applying stage even if the repeated removal-applying operations are executed, so that the productivity of ACF applying can be greatly improved. Also, as the panel size increases, the amount of use of ACFs also tends to increase, that is, the number of times of execution of removal-applying operations tends to increase. From such a viewpoint also, the constitution of this embodiment that allows efficient adaptation to increases in the number of times of ACF removal-applying operations is useful. Whereas it would be the case conventionally that about six executions of the removal-applying operation in succession causes sticking to the ACF to be next applied, providing the opening hole as in this embodiment makes it possible to prevent the occurrence of sticking even if the removal-applying operation is executed about 50 times in succession.

The present invention is not limited to the above embodiment, and may be carried out in other various modes. For example, the opening hole 45 included in the ACF applying device 10 in this embodiment is provided to form a "sheet escaping space 49" for letting ACFs escape downward so that ACFs elongated and expanded toward the upstream side of the sheet feed operation are prevented from residing and swelling in the removal-applying stage 41. An actual form in the removal-applying stage for forming such a sheet escaping space is not limited to the opening hole 45, and other various forms are adoptable.

Figure 7:
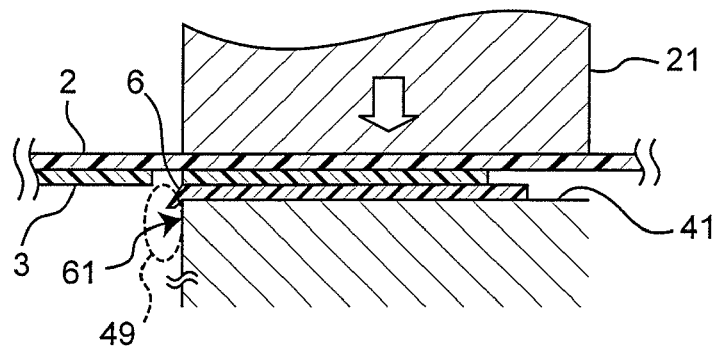
FIG. 7 is a schematic view showing a form of a removal-applying stage according to a modification of the embodiment, the form being such that an end portion of the stage is aligned with an end portion of the sheet applying region.
Figure 8:
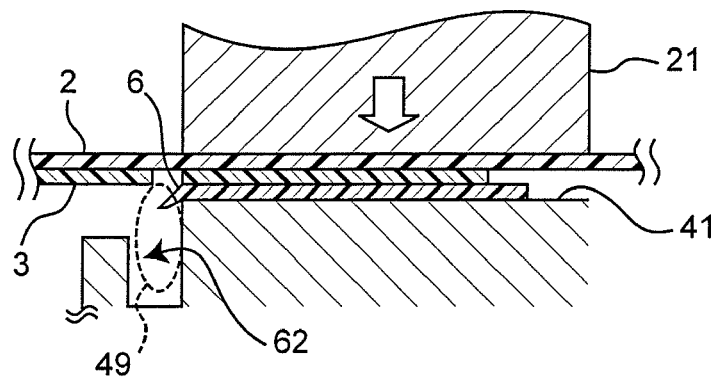
FIG. 8 is a schematic view showing a form of a removal-applying stage according to a modification of the embodiment, the form being such that a recess portion is formed in adjacency to an end portion of the sheet applying region.
Figure 9:
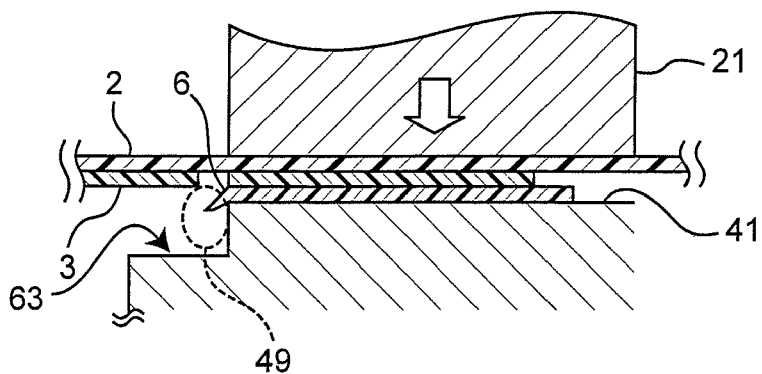
FIG. 9 is a schematic view showing a form of a removal-applying stage according to a modification of the embodiment, the form being such that a stepped portion is formed in adjacency to an end portion of the sheet applying region.

For example, as a modification of this embodiment, such forms as shown in FIGS. 7 to 9 may be adopted as the form to provide a sheet escaping space. First, FIG. 7 shows a form of the sheet escaping space which is provided by using an upstream-side end portion 61 of the removal-applying stage 41 going into an end portion opened downward as it is. In this case, the need for the formation of the opening hole or the like can be eliminated. Also, FIG. 8 shows a form resemblant to the opening hole 45. In this case, an end portion of a recess portion 62 which is not adjacent to the sheet applying region is formed lower than an adjacent end portion of the recess portion 62, so that contact of ACFs with the end portion of the recess portion can be avoided with higher reliability. FIG. 9 shows a stepped portion 63 formed at an upstream-side end portion, which case has effects similar to those of the form of FIG. 8. In any case of these forms, since the sheet escaping space can reliably be formed, the effect of this embodiment that the number of times of successive execution of the removal-applying operation can be greatly increased can be obtained.

Figure 10:
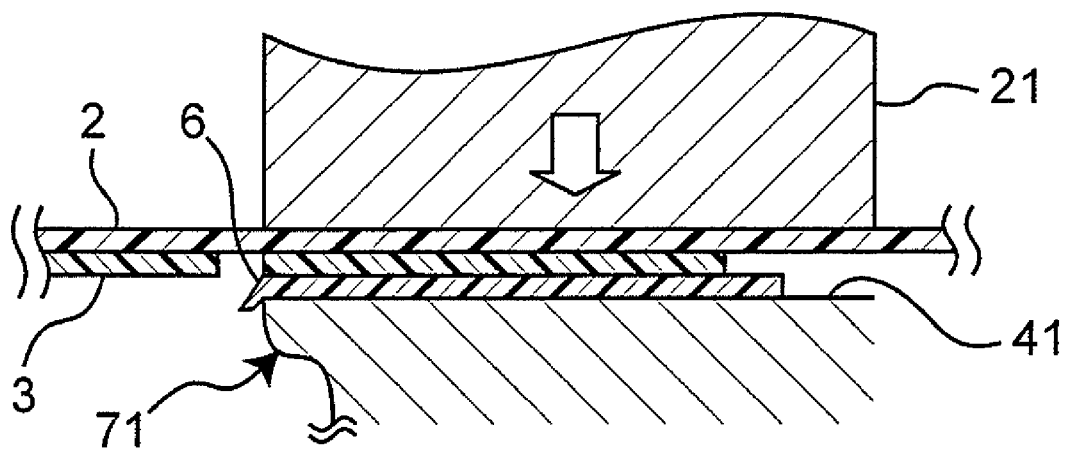
FIG. 10 is a schematic view showing a form of a removal-applying stage according to a modification of the embodiment, the form being such that an inclined portion (curved surface) inclined by more than 90 degrees is formed at an end portion of the sheet applying region.
Figure 11:
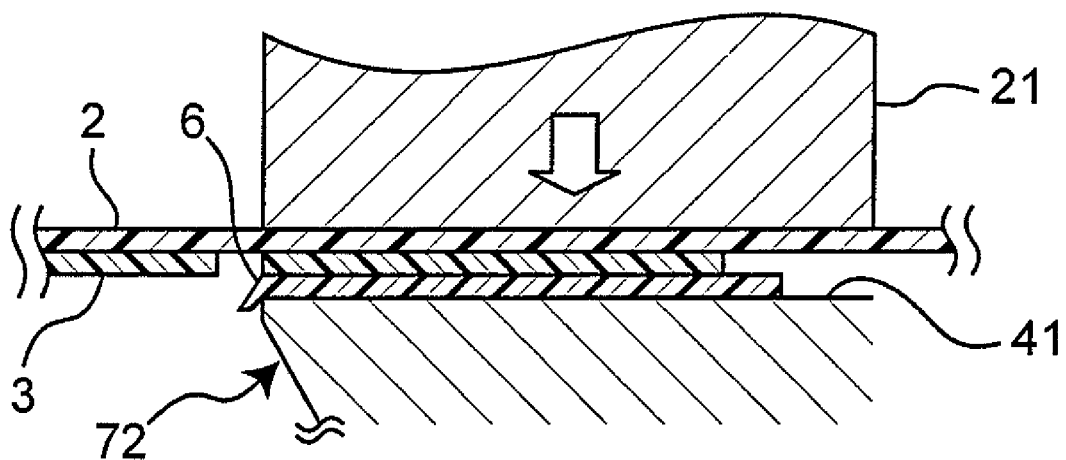
FIG. 11 is a schematic view showing a form of a removal-applying stage according to a modification of the embodiment, the form being such that an inclined portion (planar surface) inclined by more than 90 degrees is formed at an end portion of the sheet applying region.
Figure 13A:
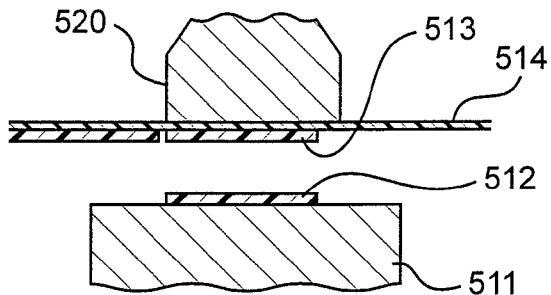
FIG. 13A is a schematic explanatory view for explaining removal-applying operation in a conventional ACF applying device, showing a state that an ACF and the removal-applying stage are aligned with each other.
Figure 13B:
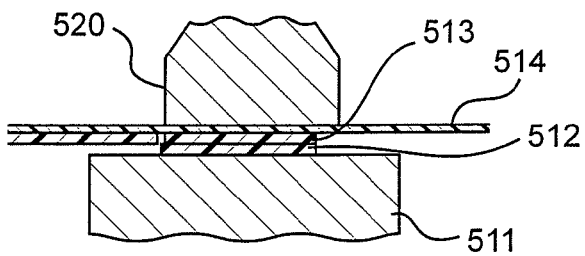
FIG. 13B is a schematic explanatory view of the removal-applying operation of a conventional ACF applying device, showing a state that a removal-applying operation is being carried out.
Figure 13C:
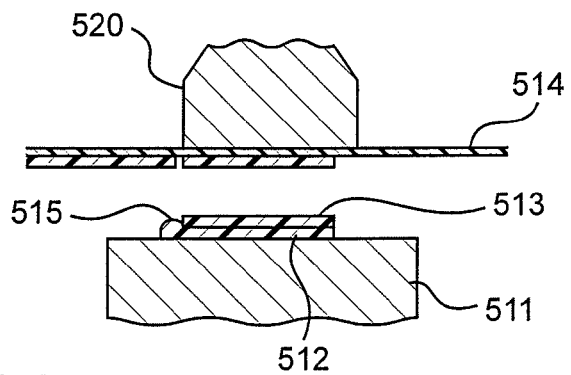
FIG. 13C is a schematic explanatory view of the removal-applying operation of the conventional ACF applying device, showing a state that a swollen portion of a removal-applied ACF has been formed.
Figure 13D:
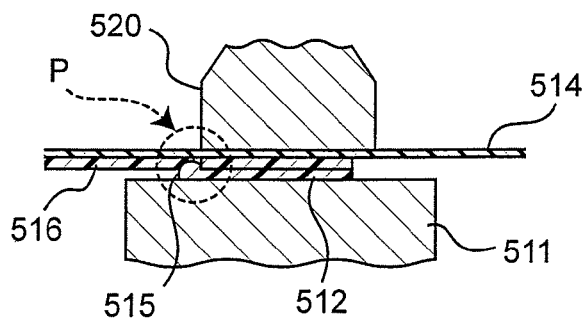
FIG. 13D is a schematic explanatory view of the removal-applying operation of the conventional ACF applying device, showing a state that part of an ACF to be next applied and a swollen portion are in contact with each other.

As other modifications of this embodiment, still other forms of the removal-applying stage are shown in the schematic views of FIGS. 10 and 11. As shown in FIGS. 10 and 11, it is also possible that the upstream-side end portion to form the sheet escaping space in the removal-applying stage 41 is inclined by more than 90 degrees with respect to the horizontal direction. With the formation of such an inclined portion 71 (formed in a curved surface) or 72 (formed in a planar surface), elongated and expanded ACFs can be let to elongate and expand while running around downward along the upstream-side end portion, so that the number of times of successive execution of the removal-applying operation can be further improved. Further, as other forms, a downwardly extending bent portion, i.e. rounded portion, may also be formed at the upstream-side end portion in the removal-applying stage 41, thus accelerating the downward directivity of elongated and expanded ACFs.

Furthermore, FIG. 12 shows a schematic view of an ACF applying device 110 according to a modification of this embodiment. In the ACF applying device 110 shown in FIG. 12, a removal-applying unit 140 differs in structure from the removal-applying unit 40 of the FIG. 1. More specifically, whereas similar in that a removal-applying stage 141 is moved between a sheet applying position S and a withdrawal position T, the removal-applying unit 140 is characterized in that the removal-applying stage 141, when having been moved to the withdrawal position T, is positioned in an equipment non-operating area in the ACF applying device 110. By setting the withdrawal position T in this way, it becomes possible to perform the removal work for already removal-applied ACFs from the removal-applying stage 141 positioned at the withdrawal position T while the applying operation of ACFs to the panel 4 is being performed in the ACF applying device 110, i.e., the production is being continued. Thus, the production efficiency can be further improved. In addition, such removal work is fulfilled by separating the ACFs, or replacing the sheet applying plate with another. It is noted here that the term "equipment non-operating area" refers to an area other than an area in which the constituent parts operate to perform the ACF applying operation to the panel 4 in the ACF applying device 110 and which does not affect the operations of the constituent members. It is noted that a table 150 which holds and moves the panel 4 and which is not shown in FIG. 1 is shown in the schematic view of the ACF applying device 110 shown in FIG. 12.

Further, in the ACF applying devices 10, 110 shown in FIGS. 1 and 12, respectively, for example, means for totalizing the number of times of ACF removal-applying, and means for instructing the removal of removal-applied ACFs, may be included in the control unit 9, so that a message instructing the removal of ACFs from the removal-applying stage can be displayed upon reach to a preset number of times of removal-applying operations.

The above embodiment has been described on a case where the before-seam ACF 3A and the after-seam ACF 3B in the ACF sheet 1 are subjected to removal-applying operations to the removal-applying stage 41 independently of each other. This is because there are some cases where the seam (junction portion) 5 is larger in thickness than the other portions depending on the specifications of the ACF sheet 1, and in such cases, pressing the before-seam ACF 3A, the after-seam ACF 3B and the seam 5 at a time by the head 21 could result in an insufficient pressing. However, depending on the specification (smallness) of the thickness of the seam 5, the removal-applying operation can also be fulfilled by pressing the before-seam ACF 3A, the after-seam ACF 3B and the seam 5 at a time by the head 21. Moreover, even with a large thickness of the seam 5, adopting a structure in which a recess portion or a cushioning member is provided at a portion on the removal-applying stage 41 side corresponding to the seam 5 makes it possible to absorb the thickness of the seam 5 in the pressing by the head 21.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-264430 filed on Sep. 28, 2006, including specification, claims, and drawings are incorporated herein by reference in its entirety.

The invention claimed is:

1. An apparatus for applying adhesive sheets in which separation sheets added adhesive sheets are fed in succession in a longitudinal sheet feeding direction, then the adhesive sheets, respectively, are applied onto an object, and then the separation sheet separated from the adhesive sheets are discharged, wherein a junction portion is formed between separation sheets by seaming together end portions of longitudinally succeeding separation sheets, the apparatus comprising:
   a placement base on which the object is to be placed;
   a sheet feeder for feeding the adhesive sheets above the object;
   a sheet cutter for cutting the adhesive sheets to a length necessary for being applied to the object;
   a sheet applying head for pressing and applying the cut adhesive sheet to the object, the sheet applying head being arranged so as to confront the placement base; and
   a sheet applying base which is arranged on the placement base so as to be withdrawable from the placement base, the sheet applying base having a sheet applying region to which adhesive sheets located closely before and after the junction portion are to be applied, the sheet applying region having an upstream end portion located at an upstream side of the sheet applying region in the longitudinal sheet feeding direction,
   wherein the sheet applying base is arranged such that the upstream end portion of the sheet applying region is opposed to an end portion of the sheet applying head, and
   wherein an opening is formed in the sheet applying base adjacent to the upstream end portion of the sheet applying region such that adhesive sheets applied to the sheet applying region can elongate and expand into the opening.

2. The apparatus of claim 1, wherein the opening adjoins the upstream end portion of the sheet applying region.

3. The apparatus of claim 2, wherein the opening is a recess portion formed in the sheet applying base and adjoining the upstream end portion of the sheet applying region.

4. The apparatus of claim 2, wherein the opening is a stepped portion formed in the sheet applying base and adjoining the upstream end portion of the sheet applying region.

5. The apparatus of claim 2, further comprising a sheet applying base moving device for moving the sheet applying base between a sheet applying position on the placement base and a sheet removal position in which the sheet applying base is withdrawn from the placement base and at which the adhesive sheet applied onto the sheet applying base is removable.

6. The apparatus of claim 2, wherein the sheet applying base comprises:
   a sheet applying plate in which the sheet applying region is set; and
   a plate support member to which the sheet applying plate is removably fitted and which supports the fitted plate,
   wherein the sheet applying region is disposed on top of the sheet applying plate, and
   wherein the opening is formed in the sheet applying plate and adjoins the upstream end portion of the sheet applying region.

7. The apparatus of claim 6, wherein the sheet applying plate is formed from a heat insulating material which is higher in thermal insulation property than the plate support member.

8. The apparatus of claim 1, wherein a downwardly directed curved portion is formed at the upstream end portion of the sheet applying region.

9. The apparatus of claim 1, wherein an end face of the upstream end portion of the sheet applying region is inclined by more than 90 degrees with respect to a horizontal direction.

10. A method for applying adhesive sheets with an apparatus which feeds separation sheets added adhesive sheets, respectively in succession in a longitudinal sheet feeding direction, then applies the adhesive sheets onto an object, and then separates and discharges the separation sheet the adhesive sheets, wherein a junction portion is formed between separation sheets by seaming together end portions of longitudinally succeeding separation sheets, the method comprising:
   providing a placement base on which the object is to be placed;
   providing a sheet feeder for feeding the adhesive sheets above the object;
   providing a sheet cutter for cutting the adhesive sheets to a length necessary for being applied to the object;
   providing a sheet applying head for pressing and applying the cut adhesive sheet to the object, the sheet applying head being arranged so as to confront the placement base;
   providing a sheet applying base which is arranged on the placement base so as to be withdrawable from the placement base, the sheet applying base having a sheet applying region to which adhesive sheets located closely before and after the junction portion are to be applied, the sheet applying region having an upstream end portion located at an upstream side of the sheet applying region in the longitudinal sheet feeding direction,
   wherein the sheet applying base is arranged such that the upstream end portion of the sheet applying region is opposed to an end portion of the sheet applying head, and wherein an opening is formed in the sheet applying base adjacent to the upstream end portion of the sheet applying region such that adhesive sheets applied to the sheet applying region can elongate and expand into the opening;
   cutting one of the adhesive sheets with the sheet cutter at a location adjacent to the junction portion;
   aligning an upstream side of the adhesive sheet with the upstream end portion of the sheet applying region, and with an upstream end portion of the sheet applying head;
   after said aligning operation, applying the adhesive sheet to the sheet applying region such that the adhesive sheet is removed from the respective separation sheet by pressing the adhesive sheet with the sheet applying head such that an upstream side of the adhesive sheet is expanded and escapes downwardly into the opening.

11. The method of claim 10, further comprising:

after said applying operation, cutting an adhesive sheet at a location adjacent to a subsequent junction portion of the separation sheet;

aligning an upstream side of the adhesive sheet with the upstream end portion of the sheet applying region, and with an upstream end portion of the sheet applying head;

after said aligning operation, applying the adhesive sheet in superimposition on the previously removed adhesive sheet such that the adhesive sheet is removed from the separation sheet by pressing the adhesive sheet with the sheet applying head such that an upstream side of each of the adhesive sheet and the previously removed adhesive sheet is expanded and escapes downwardly into the opening.

12. A method for applying adhesive sheets with an apparatus which feeds separation sheets added adhesive sheets in succession in a longitudinal sheet feeding direction, then applies the adhesive sheets onto an object, and then separates and discharges the separation sheet the adhesive sheets, wherein a junction portion is formed between separation sheets by seaming together end portions of longitudinally succeeding separation sheets, the method comprising:

providing a sheet applying base arranged on a placement base, the sheet applying base having a sheet applying region to which adhesive sheets located closely before and after the junction are to be applied, the sheet applying region having an upstream end portion located at an upstream side of the sheet applying region in the longitudinal sheet feeding direction, wherein an opening is formed in the sheet applying base adjacent to the upstream end portion of the sheet applying region;

cutting one of the adhesive sheets at a location adjacent to the junction portion;

aligning an upstream side of the adhesive sheet with the upstream end portion of the sheet applying region, and with an upstream end portion of the sheet applying head; and after said aligning operation, applying the adhesive sheet to the sheet applying region such that the adhesive sheet is removed from the respective separation sheet by pressing the adhesive sheet with the sheet applying head such that an upstream side of the adhesive sheet is expanded and escapes downwardly into the opening.

13. The method of claim 12, further comprising:

after said applying operation, cutting an adhesive sheet at a location adjacent to a subsequent junction portion of the separation sheet;

aligning an upstream side of the adhesive sheet with the upstream end portion of the sheet applying region, and with an upstream end portion of the sheet applying head;

after said aligning operation, applying the adhesive sheet in superimposition on the previously removed adhesive sheet such that the adhesive sheet is removed from the separation sheet by pressing the adhesive sheet with the sheet applying head such that an upstream side of each of the adhesive sheet and the previously removed adhesive sheet is expanded and escapes downwardly into the opening.

* * * * *